United States Patent [19]

Munakata et al.

[11] Patent Number: 5,540,245
[45] Date of Patent: Jul. 30, 1996

[54] PROCESSING EQUIPMENT OF SINGLE SUBSTRATE TRANSFER TYPE

[75] Inventors: Hideki Munakata; Shiomi Hara, Nishi-Shirakawa-gun, Japan

[73] Assignee: Shin-Etsu Handotai Co., Ltd., Tokyo, Japan

[21] Appl. No.: 374,188

[22] Filed: Jan. 18, 1995

[30] Foreign Application Priority Data

Mar. 22, 1994 [JP] Japan ................................. 6-075289

[51] Int. Cl.$^6$ ................................................. B08B 3/10
[52] U.S. Cl. ........................... 134/76; 134/105; 134/902; 134/111; 134/102.3
[58] Field of Search ........................... 134/184, 76, 108, 134/105, 111, 902, 102.3

[56] References Cited

U.S. PATENT DOCUMENTS

| | | | |
|---|---|---|---|
| 4,865,060 | 9/1989 | Shibano | 134/108 Y |
| 5,045,117 | 9/1991 | Witherell | 134/108 X |
| 5,102,504 | 4/1992 | Saito | 134/108 X |
| 5,190,065 | 3/1993 | Kovac et al. | 134/108 |
| 5,235,995 | 8/1993 | Bergman et al. | 134/902 |
| 5,314,509 | 5/1994 | Kato et al. | 134/902 |
| 5,361,787 | 11/1994 | Miyazaki et al. | 134/902 |
| 5,365,960 | 11/1994 | Bran | 134/902 |
| 5,368,054 | 11/1994 | Koretsky et al. | 134/184 |
| 5,383,483 | 1/1995 | Shibano | 134/184 |

FOREIGN PATENT DOCUMENTS

| | | | |
|---|---|---|---|
| 1-111337 | 4/1989 | Japan | 134/902 |
| 3-93230 | 4/1991 | Japan. | |

*Primary Examiner*—Frankie L. Stinson
*Attorney, Agent, or Firm*—Oliff & Berridge

[57] ABSTRACT

A wafer processing equipment of a single wafer transfer type comprising a wafer cleaning apparatus, a pure water cooling system, a pure water circulatory system, and a wafer drying apparatus for drying the cleaned wafer one by one, is disclosed. The cleaning apparatus comprises a pure water jet device for cleaning a wafer by jetting pure water to which ultrasonic wave is applied, against the main surface of the wafer, and a pure water collection tank for collecting the used water. The cooling system comprises a heat exchanger provided in the collection tank, for cooling the pure water in the collection tank. The circulatory system is for circulating pure water stored in the collection tank, through a filter for catching pollution or particles contained in the stored pure water. The drying apparatus is for drying the cleaned wafer one by one.

22 Claims, 3 Drawing Sheets

PROCESSING EQUIPMENT OF SINGLE SUBSTRATE TRANSFER TYPE

BACKGROUND OF THE INVENTION

1. Field of the Invention

The present invention relates to a processing equipment of a single substrate transfer type for cleaning and drying a substrate, e.g., a silicon wafer, a compound semiconductor wafer, a glass substrate for a liquid crystal display, a metal substrate, or the like, one by one.

2. Description of Related Art

Conventionally, a wafer cleaning apparatus comprising a pure water jet device for jetting a cleaning liquid such as pure water to which ultrasonic wave is applied, wherein a wafer is cleaned by passing through pure water jetted from the pure water jet device, is known, as described in Japanese Patent Application Laid-Open Publication No. Hei-3-93230.

Such a kind of ultrasonic cleaning apparatus is used, for example, for removing fine particles, dusts or the like on a wafer. The ultrasonic cleaning apparatus generates longitudinal pressure waves in pure water by ultrasonic vibration. The pressure waves having an energy reaches to the surface of the wafer through the pure water and strike the particles attached to the surface of the wafer several hundreds of thousands times every second by the energy, to remove the particles from the wafer surface.

However, such a conventional ultrasonic cleaning apparatus has following problems.

Since such a kind of ultrasonic cleaning apparatus does not reuse the pure water which was jetted from the pure water jet device, processing of a lot of wafers requires a large quantity of pure water, and therefore, costs for cleaning enormously increases. In order to enhance cleaning effect, it is necessary to properly maintain the temperature of the pure water. Maintenance of the proper temperature requires installation of a heat exchanger for exchanging heat between the pure water and cooling water, in the pure water jet device, the pure water supply system or the like. However, the installation of the heat exchanger in the pure water jet device exerts adverse effect on propagation of the ultrasonic wave therein. In order to avoid such adverse effect, it is necessary to provide a large-sized pure water jet device and to arrange the heat exchanger at a position in an area of the inside of the jet device which exerts no adverse effect on propagation of the ultrasonic wave.

SUMMARY OF THE INVENTION

The present invention was developed in view of the above-described problem. An object of the present invention is to provide a type of a wafer processing apparatus for cleaning and drying wafers one by one, which can reduce cost for cleaning.

In accordance with one aspect of the present invention, the wafer processing equipment of a single wafer transfer type comprising: a wafer cleaning apparatus comprising a pure water jet device for cleaning a wafer by jetting pure water to which ultrasonic wave is applied, against the main surface of the wafer, and a pure water collection tank for collecting the water which was used for cleaning of the wafer; a pure water cooling system comprising a heat exchanger which is provided in the pure water collection tank, for cooling the pure water in the collection tank; a pure water circulatory system for circulating pure water which is stored in the collection tank, through a filter for catching pollution or particles contained in the stored pure water; and a wafer drying apparatus for drying the cleaned wafer one by one.

In the above-mentioned wafer processing equipment, because the pure water which was used for cleaning wafers is circulated by the pure water circulatory system, cleaning of a lot of wafers requires only a small amount of pure water. A filter provided in the course of the circulatory system enables effective catching of pollution or particles contained in the pure water, so that it is possible to prevent re-adhesion of pollution or particles to the wafer. Since the wafer processing equipment according to the present invention is of a single wafer transfer type and does not use a cassette which is generally used in a batch processing, it is possible to prevent re-adhesion of pollution or particles to the portion of wafers with which the cassette is in contact. Furthermore, because the heat exchanger between the pure water and cooling water is provided in the pure water collection tank, it is unnecessary to provide a heat exchanger in the jet device. Therefore, the wafer processing equipment according to the present invention exerts no adverse effect on propagation of the ultrasonic wave and does not require a large-sized jet device.

Preferably, the wafer drying apparatus carries out a spin drying of the cleaned wafer. Since the wafer can be dried by spinning immediately after cleaning, a nonuniformity of dryness is not generated on the wafer, and thereby it is possible to maintain the reliability of products using the wafer. The wafer processing equipment may further comprise a hot pure water supply system for supplying hot water to the pure water collection tank. Accordingly, it is possible to fill up a deficiency of the pure water and to make a low temperature of the pure water rise, in order to enhance cleaning effect.

The wafer processing equipment may further comprise a wafer carrying apparatus which has a suction member for sucking to hold the rear surface of the wafer, on an end thereof, for carrying the suction member with the wafer into the wafer cleaning apparatus. Furthermore, the processing equipment may further comprise a wafer setting apparatus having a pair of holding members which can open and close and on the upper surface of which placing surfaces for placing a wafer and positioning side wall surfaces having a shape similar to the external shape of the wafer are formed, for transferring the cleaned wafer through the wafer cleaning apparatus to the wafer drying apparatus.

Accordingly, it is possible to surely transfer each wafer to the cleaning apparatus and to the drying apparatus, and to effectively clean the main surface of each wafer and to effectively dry the entirety of each wafer.

Preferably, the jet device comprises a vessel for storing pure water, which has a pure water inlet for introducing pure water into the vessel in one of side walls thereof, a pure water overflow outlet for draining excess pure water to the outside in the other of the side walls, and a pure water jet outlet which has a shape like a slit and extends to the longitudinal direction in the bottom wall thereof. The pure water collection tank may have a water collecting member for collecting pure water which was used for cleaning the wafer and pure water which was discharged through the pure water overflow outlet, on an upper portion thereof.

Accordingly, it is possible to reuse the used pure water through the water collecting member and the pure water inlet, and to constantly maintain the amount of the pure water stored in the vessel by the pure water overflow outlet.

An upper opening of the vessel is preferably covered by a vibrating plate having a downward depressed center portion, the lower surface of which can be in contact with the pure water in the vessel and on the upper surface of which an ultrasonic vibrator is attached. The ultrasonic vibrator may be connected with an ultrasonic oscillator which is driven by an A.C power supply.

According to such a downward depressed structure, it is possible not only to prevent a gasket sandwiched between the vessel and the vibrating plate from soaking in the pure water, and thereby to prevent pollution or particles caused by the gasket from mixing into the pure water, but also effectively to propagate ultrasonic waves to the pure water by soaking the portion of the vibrating plate in the pure water on which the ultrasonic vibrator is mounted.

The filter may comprise a first filter element having meshes and a second filter element having meshes which are small in comparison with the first filter element. Preferably, the hot pure water supply system and the pure water cooling system are properly controlled by a control device on the basis of the temperature of the pure water in the pure water collection tank or the temperature of the pure water in the pure water jet device. The processing equipment may further comprise a second circulatory system in which substances contained in used pure water are removed by using an ion exchanger, and thereafter, the pure water is returned into the collection tank.

In accordance with another aspect of the present invention, the substrate processing equipment of a single substrate transfer type comprising: a substrate cleaning apparatus comprising a pure water jet device for cleaning a substrate by jetting pure water to which ultrasonic wave is applied, against a surface of the substrate, and a pure water collection tank for collecting the water which was used for cleaning of the substrate; a pure water cooling system comprising a heat exchanger which is provided in the pure water collection tank, for cooling the pure water in the collection tank; a pure water circulatory system for circulating pure water which is stored in the collection tank, through a filter for catching pollution or particles contained in the stored pure water; and a substrate drying apparatus for drying the cleaned substrate one by one.

The substrate processing equipment of the present invention can be also applied for processing not only a wafer but a glass substrate for a liquid crystal display, a metal substrate, or the like.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

PREFERRED EMBODIMENT OF THE INVENTION

Hereinafter, a preferred embodiment of the wafer processing equipment of a single wafer transfer type according to the present invention will be explained with reference to the drawings.

Figure 1:
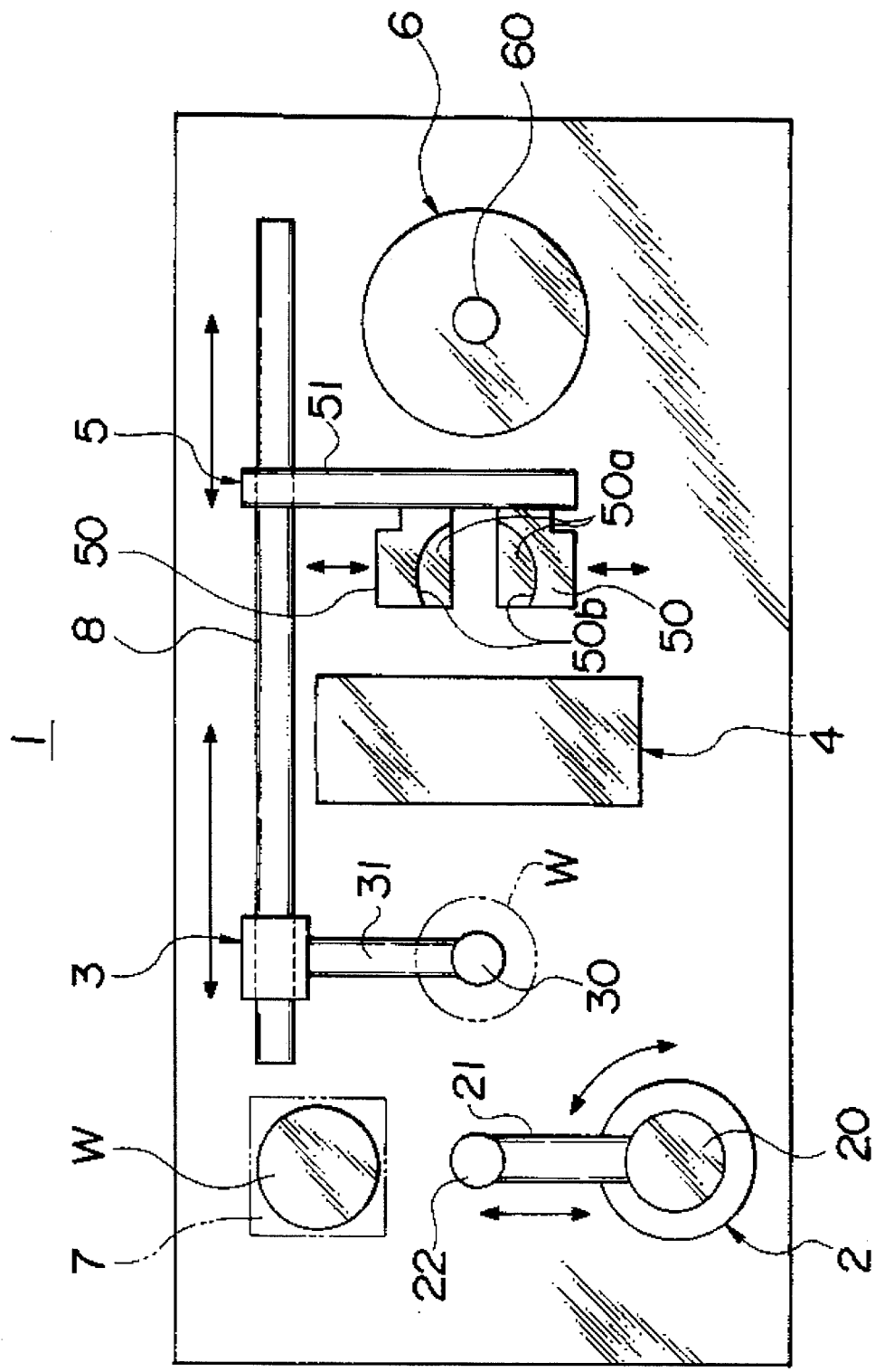
FIG. 1 is a plan view of a wafer processing equipment of a single wafer transfer type according to an embodiment of the present invention.

FIG. 1 shows the wafer processing equipment of a single wafer transfer type according to the embodiment of the present invention. The wafer processing equipment 1 of a single wafer transfer type comprises a wafer unloading apparatus 2, a wafer carrying apparatus 3, a wafer cleaning apparatus 4 which is adapted to clean one wafer at a time, a wafer setting apparatus 5, and a wafer drying apparatus 6 which is adapted to dry one wafer at a time.

The wafer unloading apparatus 2 has an arm 21 which can rotate on a shaft 20 and can extend and shorten longitudinally. On the top end of the arm 21, a suction disc 22 for sucking the main surface of the wafer W to hold the wafer thereon is provided. The wafer unloading apparatus 2 takes out the wafer W from a cassette 7 which contains a plurality of wafers, one by one, and hands the wafer W to the following wafer carrying apparatus 3.

The wafer carrying apparatus 3 has an arm 31. The arm 31 is movable along a rail 8 and has a suction disc 30 on the top end thereof for sucking the rear surface of the wafer W to hold the wafer thereon. The wafer carrying apparatus 3 receives the wafer W from the wafer unloading apparatus 2, and passes the wafer W through the wafer cleaning apparatus 4, and thereafter, hands the cleaned wafer W to the wafer setting apparatus 5.

Figure 2:
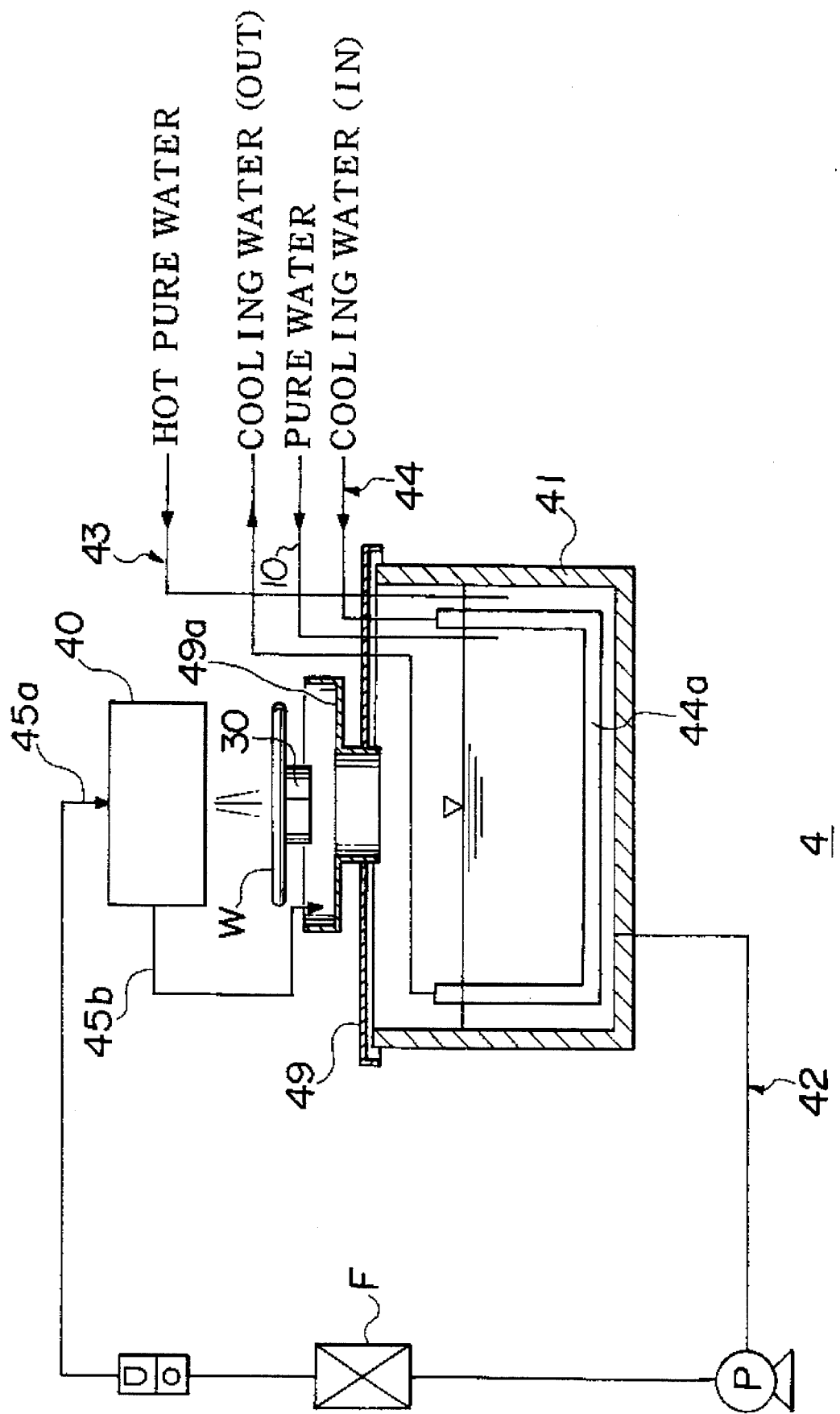
FIG. 2 is a schematic view of a wafer cleaning apparatus according to an embodiment of the present invention.

The wafer cleaning apparatus 4 comprises a pure water jet device 40 and a pure water collection tank 41, as shown in FIG. 2. The pure water collection tank 41 is communicated with the pure water jet device 40 through a pure water circulatory system 42. In the collection tank 41, a hot pure water supply system 43 and a pure water cooling system 44 are provided.

Figure 3:
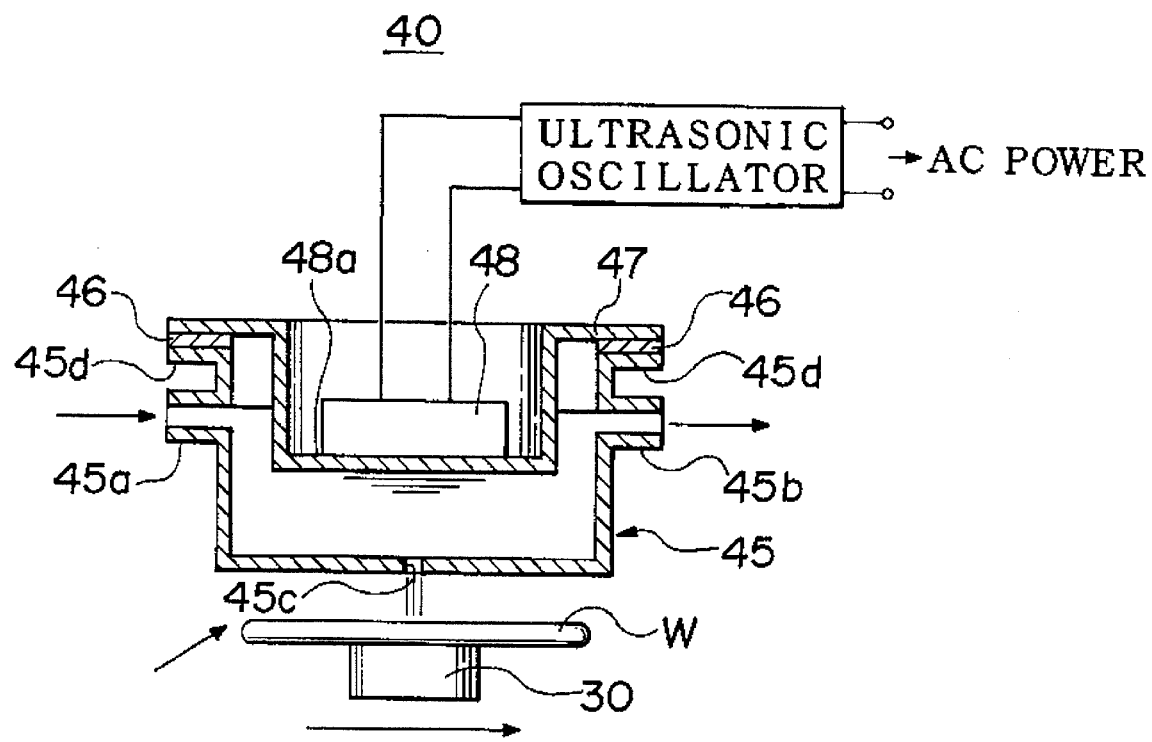
FIG. 3 is a vertical sectional view of a pure water jet device when it is seen from the front side.

The jet device 40 comprises a vessel 45 having a volume of about 0.3 liter for storing pure water, as shown in FIG. 3 which is a vertical sectional view from the front side. The vessel 45 has an approximately rectangular shape in a plan view. That is, the vessel 45 extends to the direction perpendicular to the paper surface of FIG. 3. A pure water inlet 45a for introducing pure water into the vessel 45 is formed in one of side walls of the vessel 45. A pure water overflow outlet 45b for draining excess pure water to the outside is formed in the other of side walls of the vessel 45. The overflow outlet 45b functions to constantly maintain the amount of the pure water stored in the vessel 45. A pure water jet outlet 45c is formed in the bottom wall of the vessel 45. The jet outlet 45c has a shape like a slit and extends to the longitudinal direction of the vessel 45.

The upper side of the vessel 45 is opened and a flange 45d facing outside is provided on the upper surface of the periphery of the vessel. A vibrating plate 47 made of stainless steel or the like is screwed on the flange 45d through a gasket 46. The center portion of the vibrating plate 47 is downward depressed. On the depressed portion 48a of the vibrating plate 47, an ultrasonic vibrator 48 is attached. The above depressed portion 48a is provided for the sake of not only preventing the gasket 46 sandwiched between the vessel 45 and the vibrating plate 47 from soaking in the pure water, and thereby preventing pollution or particles caused by the gasket 46 from mixing into the pure water, but also effectively propagating ultrasonic waves to the pure water by soaking the portion of the vibrating plate 47 in the pure water on which the ultrasonic vibrator 48 is mounted.

The ultrasonic vibrator 48 is connected with an ultrasonic oscillator which is connected with an A.C power supply. The ultrasonic vibrator 48 vibrates by high frequency signals of 600–1200 kHz, e.g., 950 kHz, caused by the ultrasonic oscillator.

The pure water collection tank 41 has a volume of about 40l and is made of, for example, quartz. The collection tank 41 is overlaid by a cover 49 having a water collecting member 49a thereon. The collection tank 41 with the cover 49 has a structure so that pure water which was used for cleaning the semiconductor wafer W is introduced into the collection tank 41 through the water collecting member 49a. Also pure water which was discharged through the pure water overflow outlet 45b is introduced into the collection tank 41 through the collecting member 49a.

The pure water circulatory system 42 is for feeding the pure water in the collection tank 41 back to the pure water jet device 40 through the pure water inlet 45a. In the course of the circulatory system 42, a pump P, a filter F, and a flow meter are provided. The pump P is provided for introducing pure water into the jet device 40 by increasing the pressure of the pure water. The filter F is provided for catching particles contained in the pure water. The filter F comprises a plurality of grades of filter elements, for example, comprises a combination of a first filter element which can catch particles having a diameter larger than 0.1 μm and a second filter element which can catch particles having a diameter larger than 0.05 μm, which are arranged in the described order.

The hot pure water supply system 43 is for filling up a deficiency of the pure water and for making a low temperature of the pure water rise. For example, pure water having a temperature of about 80° C. is supplied into the collection tank 41.

The pure water cooling system 44 is for lowering the temperature of the pure water in the collection tank 41. A heat exchanger 44a provided in the cooling system 44 is located in the collection tank 41. The heat exchanger 44a comprises a cooling water piping made of a material, for example, a fluorocarbon resin. Heat exchange between the cooling water, e.g., city water, flowing in the heat exchanger 44a and the pure water in the collection tank 41 is carried out by the heat exchanger 44a.

The hot pure water supply system 43 and/or the pure water cooling system 44 are properly controlled by a control device which is not shown, on the basis of the temperature of the pure water in the collection tank 41 or the temperature of the pure water in the jet device 40. The temperature of the pure water is controlled in the range of 40°–60° C., e.g., 40±5° C.

Another circulatory system which is not shown, in which substances contained in used pure water are removed by using an ion exchanger, and thereafter, the pure water is returned into the collection tank 41, may be provided. In FIG. 2, the reference numeral 10 denotes a pure water supply system.

In FIG. 1, the wafer setting apparatus 5 comprises a pair of holding members 50 and 50 which are supported by an arm 51 and can open and close. On each holding member 50, a horizontal placing surface 50a for placing a wafer W and a vertical positioning surface 50b which has approximately the same curvature as that of the external shape of the wafer W, are formed. A wafer W is placed on the pair of placing surfaces 50a and is held by the pair of positioning surfaces 50b to be positioned. The arm 51 is movable along the rail 8, and thereby the positioned wafer W is transferred to the wafer drying apparatus 6.

Figure 4:
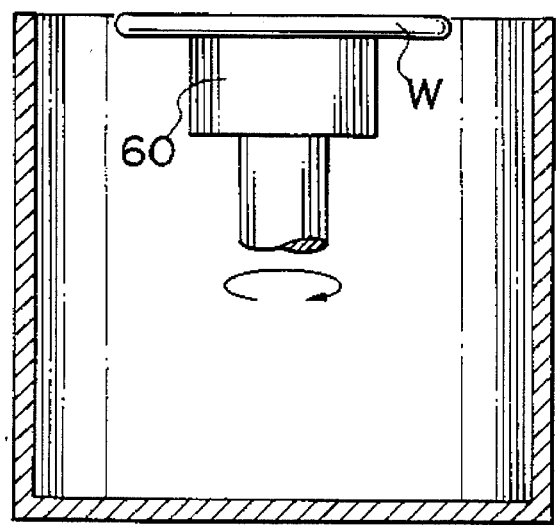
FIG. 4 is a schematic view showing a wafer drying apparatus according to an embodiment of the present invention.

The wafer drying apparatus 6 has a suction disc 60 which can suck the rear surface of the wafer W to hold the wafer, and has a structure so that the suction disc 60 can rotate at a high speed, e.g., 2000 rpm, as shown in FIG. 4.

Next, the steps of the wafer processing by the wafer processing equipment 1 of a single wafer transfer type will be explained in regular order.

A wafer W taken out from the cassette 7 by the wafer unloading apparatus 2 is transferred to the wafer carrying apparatus 3. The wafer carrying apparatus 3 passes the wafer W under the pure water jet device 40 which is installed in the wafer cleaning apparatus 4. At this time, pure water is jetted to the main surface of the wafer W by the jet device 40, and thereby the surface of the wafer W is cleaned. The moving speed of the wafer W, i.e., the carrying speed of the carrying apparatus 3, is set at a speed at which the wafer W can be sufficiently cleaned, e.g., about 7 mm/sec. After this cleaning, the wafer W is transferred to the wafer setting apparatus 5, and is transferred to the wafer drying apparatus 6 by the wafer setting apparatus 5. The wafer drying apparatus 6 carries out a spin drying of the cleaned wafer W.

According to the wafer processing equipment 1 of a single wafer transfer type of the embodiment, because the pure water which was used for cleaning wafers is circulated by the pure water circulatory system 42, only a small amount of pure water is required for cleaning of a lot of wafers W.

Furthermore, since a filter F is provided in the course of the circulatory system 42, it is possible to effectively prevent pollution or particles in the used pure water from re-adhering to the wafer W. Because the wafer processing equipment according to the present invention is of a single wafer transfer type and does not use a cassette which is usually used in a batch processing, it is possible to prevent pollution or particles from re-adhering to the portion of wafers W with which the cassette is in contact. In the wafer processing equipment 1 of a single wafer transfer type, when the filter F was comprised of a combination of a first filter element which can catch particles having a diameter larger than 0.1 μm and a second filter element which can catch particles having a diameter larger than 0.05 μm, a particle removing ratio of a level similar to that of use of chemicals such as an IPA or the like was obtained. When the filter F was used, the particle removing ratio for particles having diameters larger than 0.2 μm was approximately 90%, and that for particles having diameters larger than 1.0 μm was approximately 95%.

Furthermore, because the heat exchanger 44a for heat exchange between the pure water and cooling water is provided in the collection tank 41, it is unnecessary to provide a heat exchanger in the jet device 40. Therefore, the wafer processing equipment according to the embodiment exerts no adverse effect on propagation of the ultrasonic wave and does not require a large-sized jet device 40.

Although the present invention has been described in its preferred form with a certain degree of particularity, it should also be understood that the present invention is not limited to the preferred embodiment and that various changes and modifications may be made to the invention without departing from the spirit and scope thereof.

In the above embodiment, although only a semiconductor wafer is shown as a wafer to be processed, the present invention is not limited to this and can be also applied for processing a glass substrate for a liquid crystal display, a metal substrate or the like.

As described above, according to the present invention, only a small amount of pure water is required for cleaning of a lot of wafers. Since a filter provided in the course of the pure water circulatory system enables effective catching of pollution or particles contained in the pure water, so that it is possible to prevent re-adhesion of pollution or particles to the wafer. Since the wafer processing equipment according to the present invention is one of a single wafer transfer type and does not use a cassette which is used in a batch processing, it is possible to prevent re-adhesion of pollution or particles to the portion of the cassette with which wafers are in contact. Furthermore, because the heat exchanger for the pure water and cooling water is provided in the pure water collection tank, it is unnecessary to provide a heat exchanger in the pure water jet device. Therefore, the wafer processing equipment according to the present invention exerts no adverse effect on propagation of the ultrasonic wave and does not require a large-sized pure water jet device.

What is claimed is:

1. A wafer processing equipment of a single wafer transfer type comprising:

a wafer cleaning apparatus comprising a pure water jet device for cleaning a wafer by jetting pure water to which ultrasonic wave is applied, against a main surface of the wafer, and a pure water collection tank for collecting the water which was used for cleaning of the wafer;

a pure water cooling system comprising a heat exchanger which is provided in the pure water collection tank, for cooling the pure water in the collection tank;

a pure water circulatory system for circulating pure water which is stored in the collection tank, through a filter for catching pollution or particles contained in the stored pure water; and a wafer drying apparatus for drying the cleaned wafer one by one.

2. A wafer processing equipment as claimed in claim 1, wherein the wafer drying apparatus carries out a spin drying of the cleaned wafer.

3. A wafer processing equipment as claimed in claim 1, further comprising a hot pure water supply system for supplying hot water to the pure water collection tank.

4. A wafer processing equipment as claimed in claim 3, wherein the hot pure water supply system and the pure water cooling system are controlled by a control device on the basis of at least one of the temperature of the pure water in the pure water collection tank and the temperature of the pure water in the pure water jet device.

5. A wafer processing equipment as claimed in claim 1, further comprising a wafer carrying apparatus having a suction member to hold a rear surface of the wafer on an end thereof, for carrying the suction member with the wafer into the wafer cleaning apparatus.

6. The wafer processing equipment as claimed in claim 1, further comprising a wafer setting apparatus for transferring the cleaned wafer through the wafer cleaning apparatus to the wafer drying apparatus, the wafer setting apparatus having a pair of holding members that can open and close and on an upper surface of which are formed placing surfaces for placing a wafer and positioning side wall surfaces having a shape similar to an external shape of the wafer.

7. A wafer processing equipment as claimed in claim 1, wherein the filter comprises a first filter element having meshes and a second filter element having meshes which are small in comparison with meshes of the first filter element.

8. A wafer processing equipment as claimed in claim 1, further comprising a second circulatory system in which substances contained in used pure water are removed by using an ion exchanger, and thereafter, the pure water is returned into the collection tank.

9. A wafer processing equipment of a single wafer transfer type comprising:

a wafer cleaning apparatus comprising a pure water jet device for cleaning a wafer by jetting pure water to which ultrasonic wave is applied, against a main plane of the wafer, and a pure water collection tank for collecting the water which was used for cleaning of the wafer, wherein the pure water jet device comprises a vessel for storing pure water, which has a pure water inlet for introducing pure water into the vessel in one side wall thereof, a pure water overflow outlet for draining excess pure water to the outside in another side wall, and a pure water jet outlet which has a shape like a slit in a bottom wall thereof;

a pure water cooling system comprising a heat exchanger which is provided in the pure water collection tank, for cooling the pure water in the collection tank;

a pure water circulatory system for circulating pure water which is stored in the collection tank, through a filter for catching pollution or particles contained in the stored pure water; and a wafer drying apparatus for drying the cleaned wafer one by one.

10. The wafer processing equipment as claimed in claim 9, wherein the pure water collection tank has a water collecting member on an upper portion thereof for collecting pure water that was used for cleaning the wafer and pure water that was discharged through the pure water overflow outlet.

11. A wafer processing equipment of a single wafer transfer type comprising:

a wafer cleaning apparatus comprising pure water jet device for cleaning a wafer by jetting pure water to which ultrasonic wave is applied, against a main plane of the wafer, and a pure water collection tank for collecting the water which was used for cleaning of the wafer, wherein the pure water jet device comprises a vessel for storing pure water, which has a pure water inlet for introducing pure water into the vessel in one side wall thereof, a pure water overflow outlet for draining excess pure water to the outside in another side wall, and a pure water jet outlet which has a shape like a slit in a bottom wall thereof, and an upper opening of the vessel is covered by a vibrating plate having a downward depressed center portion, the lower surface of which can be in contact with the pure water in the vessel and on the upper surface of which an ultrasonic vibrator is attached;

a pure water cooling system comprising a heat exchanger which is provided in the pure water collection tank, for cooling the pure water in the collection tank;

a pure water circulatory system for circulating pure water which is stored in the collection tank, through a filter for catching pollution or particles contained in the stored pure water; and a wafer drying apparatus for drying the cleaned wafer one by one.

12. A wafer processing equipment as claimed in claim 11, wherein the ultrasonic vibrator is connected with an ultrasonic oscillator which is driven by an A.C power supply.

13. The wafer processing equipment according to claim 11, wherein the wafer drying apparatus carries out a spin drying of the cleaned wafer.

14. The wafer processing equipment according to claim 11, further comprising a hot pure water supply system for supplying hot water to the pure water collection tank.

15. A wafer processing equipment according to claim 14, wherein the hot pure water supply system and the pure water cooling system are controlled by a control device on the basis of at least one of the temperature of the pure water in the pure water collection tank and the temperature of the pure water in the pure water jet device.

16. The wafer processing equipment according to claim 11, further comprising a wafer carrying apparatus having a suction member to hold a rear surface of the wafer on an end thereof, for carrying the suction member with the wafer into the wafer cleaning apparatus.

17. The wafer processing equipment according to claim 11, further comprising a wafer setting apparatus for transferring the cleaned wafer through the wafer cleaning apparatus to the wafer drying apparatus, the wafer setting apparatus having a pair of holding members that can open and close and on an upper surface of which are formed placing surfaces for placing a wafer and positioning side wall surfaces having a shape similar to an external shape of the wafer.

18. The wafer processing equipment according to claim 11, wherein the pure water collection tank has a water collecting member on an upper portion thereof for collecting pure water that was used for cleaning the wafer and pure water that was discharged through the pure water overflow outlet.

19. The wafer processing equipment according to claim 11, wherein the filter comprises a first filter element having meshes and a second filter element having meshes which are small in comparison with the meshes of the first filter element.

20. A wafer processing equipment according to claim 11, further comprising a second circulatory system in which substances contained in used pure water are removed by using an ion exchanger, and thereafter, the pure water is returned into the collection tank.

21. A substrate processing equipment of a single substrate transfer type comprising:

a substrate cleaning apparatus comprising a pure water jet device for cleaning a substrate by jetting pure water to which ultrasonic wave is applied, against a surface of the substrate, and a pure water collection tank for collecting the water which was used for cleaning of the substrate, wherein the pure water jet device comprises a vessel for storing pure water, which has a pure water inlet for introducing pure water into the vessel in one side wall thereof, a pure water overflow outlet for draining excess pure water to the outside in another side wall, and a pure water jet outlet which has a shape like a slit in a bottom wall thereof;

a pure water cooling system comprising a heat exchanger which is provided in the pure water collection tank, for cooling the pure water in the collection tank;

a pure water circulatory system for circulating pure water which is stored in the collection tank, through a filter for catching pollution or particles contained in the stored pure water; and a substrate drying apparatus for drying the cleaned substrate one by one.

22. The substrate processing equipment according to 21, wherein an upper opening of the vessel is covered by a vibrating plate having a downward depressed center portion, a lower surface of which can be in contact with the pure water in the vessel and on an upper surface of which an ultrasonic vibrator is attached.

* * * * *